United States Patent [19] [11] 4,222,090
Jaffe [45] Sep. 9, 1980

[54] MICROMODULAR ELECTRONIC PACKAGE

[76] Inventor: Richard A. Jaffe, 24115 Bessemer St., Woodland Hills, Calif. 91367

[21] Appl. No.: 854,846

[22] Filed: Nov. 25, 1977

[51] Int. Cl.² ............................................. H05K 7/20
[52] U.S. Cl. .............................. 361/386; 339/17 CF; 361/401
[58] Field of Search ...................... 174/16 HS, 52 FP; 329/17 CF, 112 R; 357/81; 361/386-389, 401; 165/80, 105

[56] References Cited

U.S. PATENT DOCUMENTS

| | | | |
|---|---|---|---|
| 3,335,327 | 8/1967 | Damon | 361/401 |
| 3,621,338 | 11/1971 | Rogers | 361/401 |
| 3,825,876 | 7/1974 | Damon | 339/17 CF |
| 3,942,854 | 3/1976 | Klein | 339/112 R |
| 3,963,315 | 6/1976 | Bonis | 339/17 CF |
| 4,012,769 | 3/1977 | Edwards | 174/16 HS |

Primary Examiner—Gerald P. Tolin
Attorney, Agent, or Firm—Roger A. Marrs

[57] ABSTRACT

A micromodular electronic circuit package is disclosed herein constituting a discrete electronic component of sandwich construction having reduced physical density which, in one form, comprises an insulating panel supporting a pair of spaced-apart metal connectors, the opposite side of which supports an insulative stiffener. The stiffener is provided with a cavity centrally located so as to receive and hold a discrete component unit such as a thin film or chip capacitor, resistor or the like. The chip is provided with connection ends that respectively engage with the pair of metal connectors supported on the insulative panel so that mechanical and electrical interconnection is produced. In another form, the component package includes a heat sink slideably engageable over the electronic package for effecting the dissipation of heat during circuit operation.

1 Claim, 5 Drawing Figures

U.S. Patent  Sep. 9, 1980  4,222,090
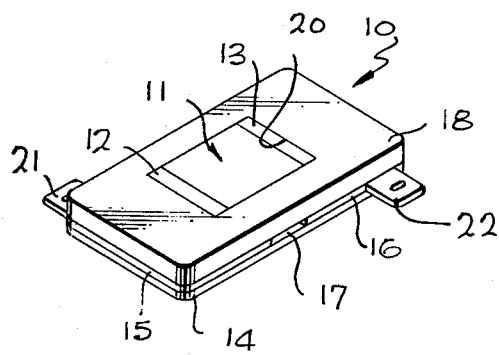
FIG.1
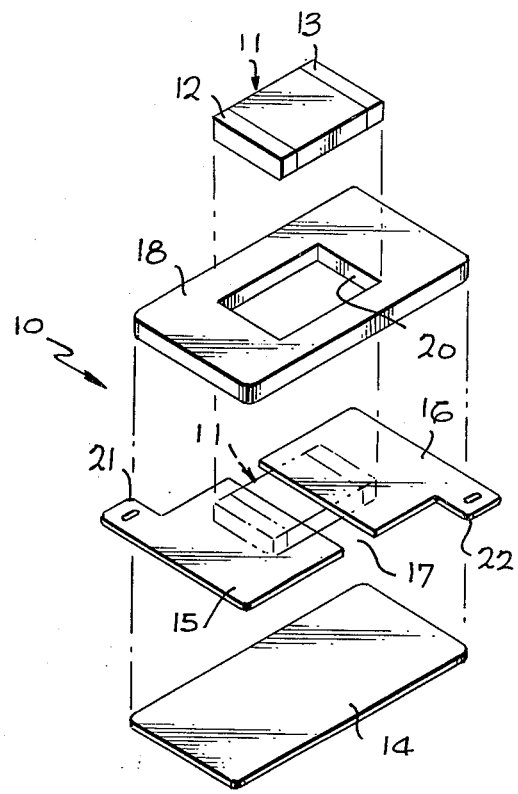
FIG.2
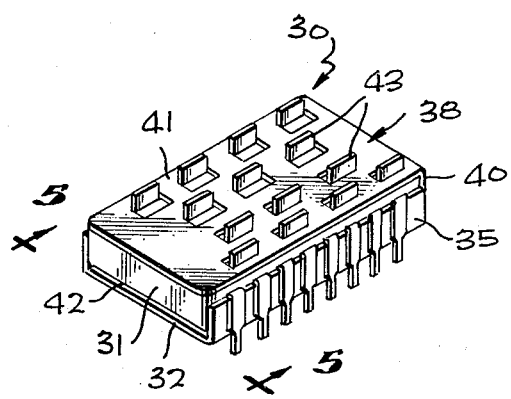
FIG.3
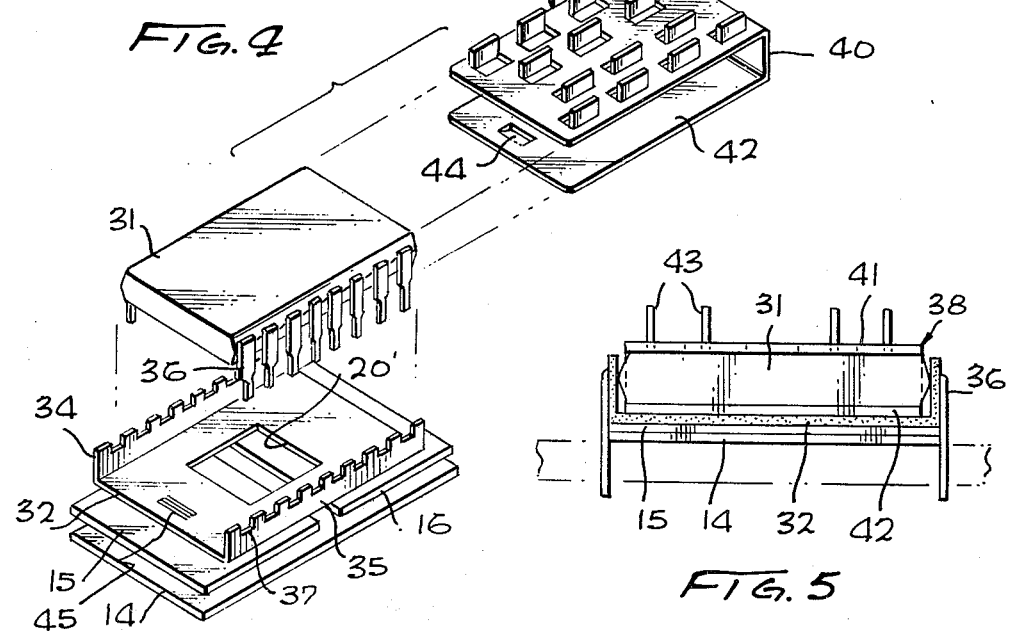
FIG.4
FIG.5

MICROMODULAR ELECTRONIC PACKAGE

BACKGROUND OF THE INVENTION

1. Field of the Invention

This invention relates to electronic microminiature modules and, more particularly, to a novel modular package having a sandwich construction and heat sink apparatus which provides reliable mechanical and electrical securement between the active elements of the module and conductive terminals carried on the module.

2. Brief Description of the Prior Art

As the usefulness of electronic equipment has expanded with the increase in technological improvement and with the widening demand, both militarily and commercially for equipment capable of handling vast quantities of information at increased rates of speed, the need for high density electronic packaging has become of increasing importance. A concomitant of this trend is the need for circuit protection and miniaturization which, while providing the requisite component density, maintains both system reliability and serviceability. Under the thrust of this expanding use, it has become an economic necessity to provide a circuit component construction which is of reduced density and which includes interconnecting means for coupling into the electronic equipment which both minimizes the possibility of error in field maintenance procedures and reduces overall system complexity.

With increasing component packaging density, the reliability of circuit interconnections and heat dissipation has become of paramount significance. Particularly, this is true with respect to the design, construction and interconnection of circuit components and assemblages which carry out the basic work function of the electronic equipment. Conventionally, the electrical circuit network generally comprises a plurality of logic circuits such as "gates" and "flip-flops" interconnected to form an electronic complex designed to carry out the various arithmetical and logical functions for which the equipment is programmed.

These basic circuits lend themselves to compact arrangement on printed circuit boards or cards or on substrates in thin film semiconductor form wherein discrete components are employed. The substrate or printed circuit board generally carries strips of conductive material disposed in a predetermined pattern terminating in conductive pads arranged along one or more sides of the substrate or board which are employed for external connection purposes so as to permit interconnection of the circuit carried on the substrate or board with other associated circuits mounted on the electronic equipment.

One means for making mechanical and electrical contact with the conductive pads on a substrate or circuit board comprises the use of pins or leads that are attached to the respective conductive pads at one end, and having their opposite ends exposed exteriorly of the packaging module for external connection with other equipment such as a larger printed circuit board. Normally, the pins or leads are attached to the conductive pads by means of hand soldering, welding or bonding techniques, and the substrates, including the pins or leads are then mounted in a suitable case. Next, a suitable potting compound is used to encapsulate both the active and passive devices carried on the substrate as well as the pins and lead connections with the conductive pads. In this fashion, a conventional modular package is produced.

However, problems and difficulties have been encountered when fabricating and using such a modular package, which stem largely from the fact that many of the fabricating procedures require hand or manual operations which are time consuming, and such fabrication procedures are susceptible to inaccuracies and faulty connections caused by human error. Also, the substrate material, potting compound, and the package casing material generally have different coefficients of expansion, so that when the module is subjected to temperature cycling during the operation of the unit within its given environment, the securement between the pins or leads with the respective conductive pads have a tendency to shear and interrupt circuit continuity. Furthermore, the size of the component is relatively large when assembled as compared to the active or passive elements comprising portions of the total package.

Therefore, a long standing need has existed to provide a microminiature electronic package which incorporates a heat sink for heat dissipation purposes and an electronic package of miniature construction which lends itself to high density assembly on a circuit board or substrate.

SUMMARY OF THE INVENTION

Accordingly, the above problems and difficulties are obviated by the present invention which provides a novel microminiature electronic package comprising a sandwich construction which, in one form, includes an elongated flat panel of electrically insulative material on which is carried a pair of metal connectors arranged in fixed spaced-apart relationship. The metal connectors include tabs which outwardly project beyond the edge-marginal region of the supportive insulative panel. A stiffener panel is carried on the side of the pair of metal connectors opposite to its side supported on the insulative panel which is of the same dimension as the insulative panel wherein the tabs of the conductors project outwardly from the edge thereof. The stiffener panel is formed with a central cavity occupied by an active electronic component such as a capacitor, resistor or the like. The opposite ends of the active component or material are provided with connecting means for electrically and mechanically interconnecting with the pair of connectors carried between the insulative stiffener panel and the support panel.

Additionally, a heat sink means may be slideably engaged over the component construction which dissipates heat into the ambient atmosphere during operation of the component. In one form, the heat sink includes a clip-like member of U-shaped cross-section that may be readily slid over the discrete component so that a heat transfer relationship is established. The heat sink clip includes a plurality of fins or vanes outwardly projecting from one side so as to offer increased surface area exposed to atmosphere for heat exchange. The clip further includes means for detachably connecting the heat sink to the component package.

Therefore, it is among the primary objects of the present invention to provide a novel heat sink and miniaturized component sandwich construction whereby a microminiature electronic component module is produced, having the capability of high density assemblage on a substrate or circuit board.

Another object of the present invention is to provide a novel high density component package of microminiature construction wherein a plurality of such components may be readily mounted and arranged on a circuit board in high density relationship as compared to conventional arrangements.

Another object of the present invention is to provide a novel electronic component package capable of high density arrangement on a circuit board which is relatively inexpensive to manufacture and which may be fabricated in a reliable fashion.

Still a further object of the present invention is to provide a novel electronic component of a sandwich construction having increased high density employment on a circuit board or substrate and which is capable of heat dissipation during circuit operation.

BRIEF DESCRIPTION OF THE DRAWINGS

The features of the present invention which are believed to be novel are set forth with particularity in the appended claims. The present invention, both as to its organization and manner of operation, together with further objects and advantages thereof, may best be understood by reference to the following description, taken in connection with the accompanying drawings in which:

FIG. 1 is an enlarged perspective view showing the novel electronic miniature module of the present invention;

FIG. 2 is a perspective exploded view of the electronic component shown in FIG. 1;

FIG. 3 is a view similar to the view shown in FIG. 1 wherein the electronic package includes a heat dissipating means in accordance with the present invention;

FIG. 4 is an exploded perspective view showing the arrangement of modular construction of the electronic module of the present invention incorporating the heat dissipating means; and FIG. 5 is a sectional view taken in the direction of arrows 5—5 of FIG. 3 showing the electronic package module incorporating the heat dissipating means.

DESCRIPTION OF THE PREFERRED EMBODIMENT

Referring to FIG. 1, a novel miniature electronic component is illustrated in the general direction of arrow 10 and which is constructed in accordance with the present invention. In general, the electronic component may be of any component characteristics such as a capacitor, resistor, inductor or the like. However, for purposes of clarification the active or passive component will be identified as electronic material 11 having opposite ends associated with conductive portions 12 and 13. The electronic component may be fabricated from semiconductor materials or may be a discrete component such as a chip capacitor or resistor. It is to be understood that the active or passive component 11 does not form a part of the present invention but that the invention relates to the manner and means of mounting the passive or active component on a printed circuit board or substrate and also relates to the interconnection of the connecting ends 12 and 13 for connection with pads, pins or other connectors associated with the mounting printed circuit board or substrate.

Towards this end, the electronic component package of the present invention shown in the direction of arrow 10 includes a base panel 14 of electrically insulative material on which is supported a pair of metallic conductors 15 and 16. The metallic conductors are arranged in fixed spaced apart relationship so that a gap is defined between opposing edges thereof and the gap is illustrated by the numeral 17. On top of the metal conductors and secured thereto is a stiffener panel 18 which includes a cavity 20 occupied by the active or passive component 11. The entire package 10 is elongated or rectangular in shape and it can be seen that the general configuration is identical with respect to the panels 14 and 18 so that the edge marginal regions are in vertical alignment. However, attention is directed to the fact that each of the component metallic conductors includes a tab which outwardly projects beyond the perimeter of the panels 14 and 18 respectively. For example, metal conductor 15 includes a tab or lug 21 while tab or lug 22 is carried on the metal connector 16. Preferrably, the tabs or lugs include holes for attachment to pins, screws, solder connections or the like.

Referring now in detail to FIG. 2, it can be seen that the electronic component 10 is of a sandwich construction and that the base for the construction is the elongated electrically insulative panel 14. One side of the panel 14 supports the metal conductors 15 and 16 and the connectors are secured thereto by any suitable means such as adhesive. The metal conductors are arranged so that the respective tabs 21 and 22 will outwardly project from opposite ends of the component and, preferrably, outwardly project from opposite sides of the component. In this view, it can be seen that the gap 17 is defined between the opposing and adjacent ends of the metal conductors 15 and 16. The gap so defined is an air gap; however, insulative material may be placed therebetween if desired. Attached on top of the metal conductors 15 and 16 is the elongated stiffener panel 18 and securement may be made by a suitable adhesive. The central cavity 20 is of size and dimension to accomodate occupation by a passive or active material 11 or a discrete component such as a resistor or capacitor. In either event, the component includes terminals or conductors at its opposite end which are placed in mechanical and electrical contact with the metal conductors 15 and 16. Soldering or other fabricating processes may be employed for achieving the connection and such does not form a part of the present invention.

Referring now to FIG. 3, a heat sink for an electronic package is illustrated in the general direction of arrow 30 and in this embodiment, the electronic package may take the form of a standard dual in-line intergrated circuit package 31. The passive or active component of the package is carried between the confines of a two part construction within the cavity 20', as shown more clearly in FIG. 4. The lower or support part formed with cavity 20 is identified by numeral 32 while the upper part or component package is identified by numeral 31. The support part includes a pair of side rails 34 and 35 which include a plurality of open ended slots formed therein which are adapted to receive downwardly depending terminals carried along the side edges of the upper part. For example, terminal 36 will be received within the first slot identified by number 37 carried on rail 35. The remaining lugs or terminals will mate with their associated and respective slots along the opposite sides of the rails. Thus far, a conventional electronic package 31 is contemplated and has been described as such so that it does not form a part of the present invention. The present invention includes a heat dissipating means for transferring heat generated during the electrical operation of the component into the ambient atmosphere. The heat dissipating means is illustrated in the general direction of arrow 38 and can be seen as a clip which is slideably engageable over electronic component 31. The clip is composed of a suitable heat conducting metal and is of a general U-shape in cross-section so that it may be slid over the respective parts of component package 31. One end of the clip is open-ended, while its opposite end, identified by numeral 40, resiliently supports legs or panels 41 and 42. Panel 41 includes a plurality of outwardly projecting fins 43 which serve as heat radiators and provide maximum area to the ambient atmosphere for heat transference or exchange.

Panel 42 includes a tang 44 which downwardly depends from one end thereof so as to releasably engage with a saw-tooth arrangement 45 carried on the panel 32 of the package. Therefore, when the clip 38 is slid over the component package 31, the tang 44 will slide in one direction until it snap-locks with a selected one of the teeth in the saw-tooth arrangement 45. The clip constituting the heat dissipating means will be fixly attached at this time.

Once the heat sink, 38 has been assembled with the component package 31, connectors or conductors 15 and 16 may be installed along the underside of panel 32 as previously described in electrical connection with the active component located in the cavity 20. The support panel 14 may be attached to the underside to complete the assembly.

As seen in FIG. 5, the panel 42 is situated between the discrete component 31 and the panel 32, while the finned panel 41 is adjacent the opposite side of the discrete component 31. Heat gathered from component 31 by the panels 41 and 42 are dissipated into the ambient atmosphere via the fins 43.

In view of the foregoing, it can be seen that the novel electronic miniature component package of the present invention provides a package of high density whereby a plurality of such packages may be arranged in close proximity to each other so as to conserve space. Also, temperature control is achieved by the novel heat dissipating means wherein heat produced during operation of the electronic component is collected and transferred into the ambient atmosphere via the finned arrangement.

While particular embodiments of the present invention have been shown and described, it will be obvious to those skilled in the art that changes and modifications may be made without departing from this invention in its broader aspects and, therefore, the aim in the appended claims is to cover all such changes and modifications as fall within the true spirit and scope of this invention.

What is claimed is:

1. A micromodular electronic component package comprising:

an electrically insulative base member;

a pair of electrically conductive members carried on said base member in fixed spaced apart relationship so as to define a gap between adjacent ends of said conductive members;

a rigid spacer of electrically insulative material fixly carried on said conductive members and provided with a central cavity exposing portions of said conductive members and said gap therebetween;

a first electrical component secured to said rigid spacer within said cavity so as to totally occupy said cavity and having connective terminal ends in electrical and mechanical securement with the respective exposed portions of said conductive members;

said conductive members include lugs carried on the edges thereof outwardly projecting from the perimeter of said component package and being fully exposed for external connection therewith;

said electronic component package further incudes a second electrical component and a heat sink means substantially surrounding said second electrical component and arranged in heat transference relationship therewith;

said heat sink means is a clip-like element of U-shaped configuration in side elevation;

said heat sink element is releasably arranged about said second electrical component in snap-lock relationship;

said heat sink element includes a plurality of fins outwardly projecting from an exposed surface thereof in heat dissipating transference with surrounding environment;

said conductive member lugs are arranged at opposite ends of said package and outwardly project from opposite sides of said package.

* * * * *